US010834830B2

(12) United States Patent
Jeanson et al.

(10) Patent No.: US 10,834,830 B2
(45) Date of Patent: Nov. 10, 2020

(54) CREATING IN-VIA ROUTING WITH A LIGHT PIPE

(71) Applicant: International Business Machines Corporation, Armonk, NY (US)

(72) Inventors: Mark J. Jeanson, Rochester, MN (US); Darryl Becker, Rochester, MN (US); Gerald Bartley, Rochester, MN (US); Matthew S. Doyle, Chatfield, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/274,565

(22) Filed: Feb. 13, 2019

(65) Prior Publication Data

US 2020/0260594 A1   Aug. 13, 2020

(51) Int. Cl.
*H01K 3/10* (2006.01)
*H05K 3/46* (2006.01)
*H05K 3/06* (2006.01)
*H05K 3/42* (2006.01)

(52) U.S. Cl.
CPC .......... *H05K 3/4673* (2013.01); *H05K 3/064* (2013.01); *H05K 3/42* (2013.01); *H05K 2201/09581* (2013.01); *H05K 2203/0703* (2013.01); *Y10T 29/49165* (2015.01)

(58) Field of Classification Search
CPC ......... H05K 1/144; H05K 2201/09609; H01R 13/665; H01F 2017/002; H01F 5/003; Y10T 29/49826; Y10T 29/49165
USPC .................. 29/852, 825, 829, 846, 847, 853
See application file for complete search history.

(56) References Cited

U.S. PATENT DOCUMENTS

| 3,284,322 A | 11/1966 | Pearlstein |
| 4,883,571 A | 11/1989 | Kondo et al. |
| 5,185,625 A | 2/1993 | Abe et al. |
| 5,691,541 A | 11/1997 | Ceglio et al. |
| 5,708,569 A | 1/1998 | Howard et al. |
| 5,870,176 A | 2/1999 | Sweatt et al. |

(Continued)

FOREIGN PATENT DOCUMENTS

| CN | 101351083 A | 1/2009 |
| CN | 106163107 A | 11/2016 |

(Continued)

OTHER PUBLICATIONS

U.S. Appl. No. 15/881,205, to Gerald Bartley et al., entitled, *Creating Inductors, Resistors, Capacitors and Other Structures in Printed Circuit Board VIAS with Light Pipe Technology*, assigned to International Business Machines Corporation, 45 pages , filed Jan. 26, 2018.

(Continued)

*Primary Examiner* — Thiem D Phan
(74) *Attorney, Agent, or Firm* — Nathan M. Rau

(57) ABSTRACT

Creating in-via routing with a light pipe is disclosed. A resist layer is applied over a layer of conductive material provided in a via. A light pipe is inserted into the via. The surface of the light pipe includes at least one masked portion and at least one unmasked portion. A portion of the resist layer is exposed with light emitted from the unmasked portions of the light pipe. Portions of the conductive layer corresponding to the exposed portion of the resist layer are then removed to create the in-via routing.

7 Claims, 21 Drawing Sheets

(56) References Cited

U.S. PATENT DOCUMENTS

| | | | |
|---|---|---|---|
| 6,091,310 | A | 7/2000 | Utsumi et al. |
| 7,197,202 | B2 | 3/2007 | Kim et al. |
| 8,232,194 | B2 | 7/2012 | Trezza |
| 8,279,022 | B2 | 10/2012 | Thom et al. |
| 9,113,569 | B2 | 8/2015 | Takenaka |
| 9,781,830 | B2 | 10/2017 | Iketani et al. |
| 2003/0032246 | A1 | 2/2003 | Nagaya et al. |
| 2005/0025403 | A1 | 2/2005 | Ueda et al. |
| 2005/0093672 | A1 | 5/2005 | Harding |
| 2005/0112798 | A1 | 5/2005 | Bjorbell |
| 2009/0046345 | A1 | 2/2009 | Hsu |
| 2015/0327371 | A1 | 11/2015 | Huang et al. |
| 2017/0296319 | A1 | 10/2017 | Peery |
| 2019/0239358 | A1* | 8/2019 | Bartley ................ H01C 17/065 |

FOREIGN PATENT DOCUMENTS

| | | |
|---|---|---|
| CN | 106982521 A | 7/2017 |
| CN | 108124383 A | 6/2018 |
| CN | 108156748 A | 6/2018 |
| JP | 11354326 A | 12/1999 |
| JP | 2015053363 A | 3/2015 |

OTHER PUBLICATIONS

Appendix P; List of IBM Patent or Applications Treated as Related, Feb. 13, 2019, 2 pages.

International Search Report Issued in PCT/IB2019/050188 dated Apr. 24, 2019, 8 pages.

\* cited by examiner

CREATING IN-VIA ROUTING WITH A LIGHT PIPE

BACKGROUND

Field of the Invention

The field of the invention relates to conductive vias in printed circuit boards, or, more specifically, methods, apparatus, and products for creating in-via routing with a light pipe.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

As computer systems become more complex, there is an ever-growing need to fabricate complex electrical circuits while minimizing the space occupied by electrical components. To that end, circuits fabricated on printed circuit boards frequently consist of multiple electrical traces distributed over multiple layers, or planes, of the printed circuit board (PCB). Electrical traces on surfaces and different interior planes of the PCB may be electrically connected with a plated through hole, or plated via. A via is a hole in a PCB that may be plated with electrically conductive material on its sides so that two or more traces intersecting the via may be electrically connected.

PCB vias are typically constructed to electrically connect signals to different planes of the printed circuit board. There are instances where a single via location could connect more than one electrical signal. Although there are methods for splitting vias through mechanical means, these vias are typically split in the X or Y direction. Typically, vias transfer only single function, whether power or a signal, in Z direction of the PCB. Furthermore, for various reasons such as time, cost, or complexity, it is desirable to avoid mechanical processing to achieve a split via.

SUMMARY

Embodiments of the present invention provide the ability to split a via the Z direction without the need for post-plating mechanical processing of the via using light pipe technology. By splitting the via in the Z direction, multiple signals may be transferred in the Z direction of the PCB thereby providing more space efficiency in circuit design and implementation.

An embodiment in the present disclosure is directed to a method of creating in-via routing with a light pipe, the method comprising applying a resist layer over a layer of conductive material provided in a via, inserting the light pipe into the via, wherein the surface of the light pipe includes at least one masked portion and at least one unmasked portion, exposing a portion of the resist layer with light emitted from the at least one unmasked portion of the light pipe, and removing a portion of the conductive layer corresponding to the exposed portion of the resist layer.

Another embodiment in the present disclosure is directed to a system for creating in-via routing with a light pipe, the apparatus comprising, a light pipe, wherein the surface of the light pipe includes at least one masked portion and at least one unmasked portion, a light source, and a via in which is disposed a layer of conductive material, wherein the system is configured to carry out the steps of: applying a resist layer over the layer of conductive material provided in a via, inserting the light pipe into the via, exposing a portion of the resist layer with light emitted from the at least one unmasked portion of the light pipe, and removing a portion of the conductive layer corresponding to the exposed portion of the resist layer.

Yet another embodiment in the present disclosure is directed to a multilayer printed circuit board comprising at least two conductive traces, at least one insulator layer separating the at least two conductive traces, and at least one via in a direction perpendicular to a plane of the printed circuit board that intersects the at least two conductive traces, wherein the at least one via is configured with in-via routing, wherein the in-via routing is form by: applying a resist layer over a layer of conductive material provided in the via, inserting the light pipe into the via, exposing a portion of the resist layer with light emitted from the at least one unmasked portion of the light pipe, and removing a portion of the conductive layer corresponding to the exposed portion of the resist layer.

In some embodiments, applying a resist layer over a layer of conductive material provided in a via includes providing the via, wherein the via has been plated with the conductive material. In further embodiments, removing a portion of the conductive layer corresponding to the exposed portion of the resist layer includes etching the via with acid. In various embodiments, the resist layer is a positive photoresist material. In still further embodiments, removing a portion of the conductive layer corresponding to the exposed portion of the resist layer creating at least two independent connections between in the via. In still further embodiments, further plating of the via with additional conductive material is omitted. In yet a further embodiment, further drilling of the via is omitted.

In still further embodiments, removing a portion of the conductive layer corresponding to the exposed portion of the resist layer includes removing a conductive stub between a conductive pad on a surface of the printed circuit board and a conductive trace in an interior layer of the printed circuit board. Removing a portion of the conductive layer corresponding to the exposed portion of the resist layer may also include removing partially removing conductive material between a first conductor in a first interior layer of the printed circuit board and a second conductor in a second interior layer of the circuit board.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
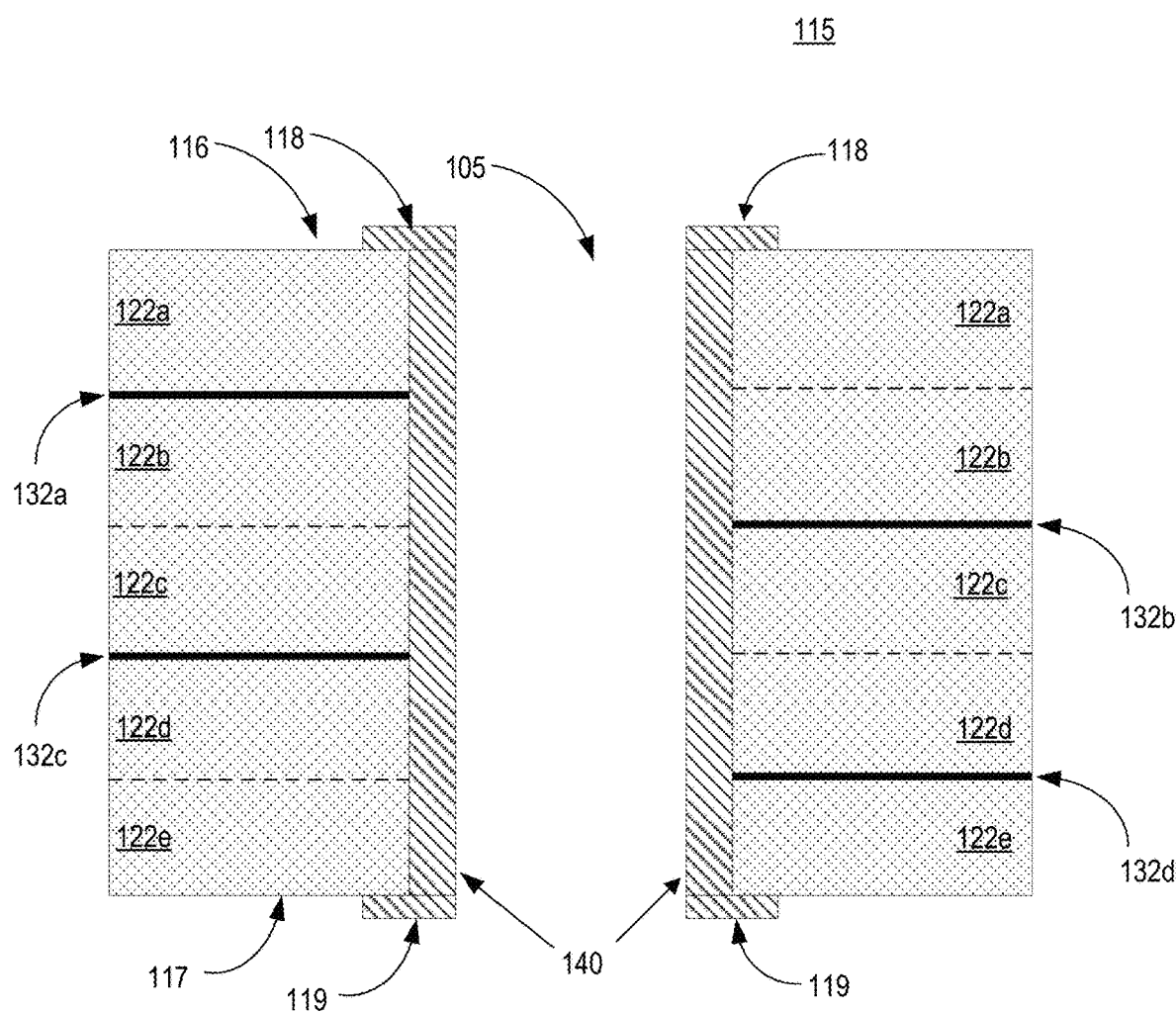
FIG. 1 is a diagram illustrating a cross-section view of an exemplary printed circuit board.

Exemplary methods, apparatus, and products for creating in-via routing with a light pipe in accordance with the present invention are described with reference to the accompanying drawings, beginning with FIG. 1. FIG. 1 sets forth a cross-sectional via of an exemplary multilayer printed circuit board (PCB) (115) configured for creating in-via routing with a light pipe according to embodiments of the present invention. The multilayer PCB (115) of FIG. 1 includes a via (105) that is a drilled through-hole from an annular conductive pad (118) on a top exposed surface (116) to an annular conductive pad (119) on a bottom exposed surface (117). The top surface (116) and bottom surface (117) of the PCB may have formed thereon conductive traces connecting to the conductive pads (118, 119). The interior of the PCB (115) includes wiring planes in which the electrically conductive traces (132a, 132b, 132c, 132d) are formed, and which are separated by insulating layers (122a, 122b, 122c, 122d, 122e) comprised of an insulating material. Via (105) intersects the traces (132a, 132b, 132c, 132d) and is lined with a conductive material (140) thereby forming a conductive conduit that may connect some or all of the traces (132a, 132b, 132c, 132d). In some embodiments of the present disclosure, the conductive material is copper. The arrangement and quantity of the interior traces (132a, 132b, 132c, 132d) and insulating layers (122a, 122b, 122c, 122d, 122e) in the PCB (115) illustrated in FIG. 1 are for explanation, not for limitation.

Figure 2:
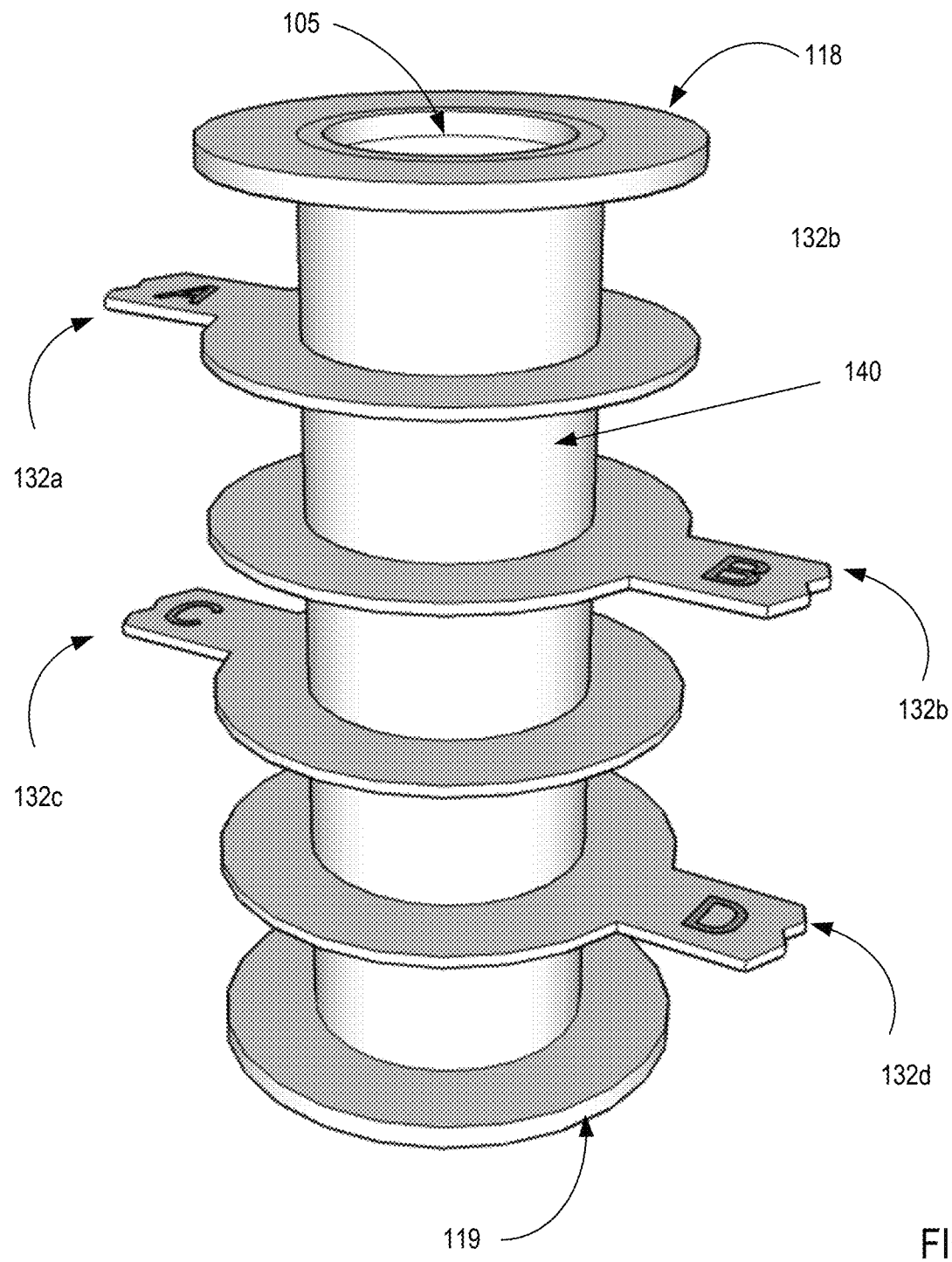
FIG. 2 is a diagram illustrating a 3-dimensional view of an exemplary via.

For further explanation, FIG. 2 illustrates an exemplary three-dimensional view of via (105) in which the insulating layers (122a, 122b, 122c, 122d, 122e) shown in FIG. 1 are omitted for clarity. FIG. 2 shows the via (105), as depicted in FIG. 1, intersecting the interior traces (132a, 132b, 132c, 132d) at circular pad sections, which are electrically connected by the conductive material (140).

Figure 3:
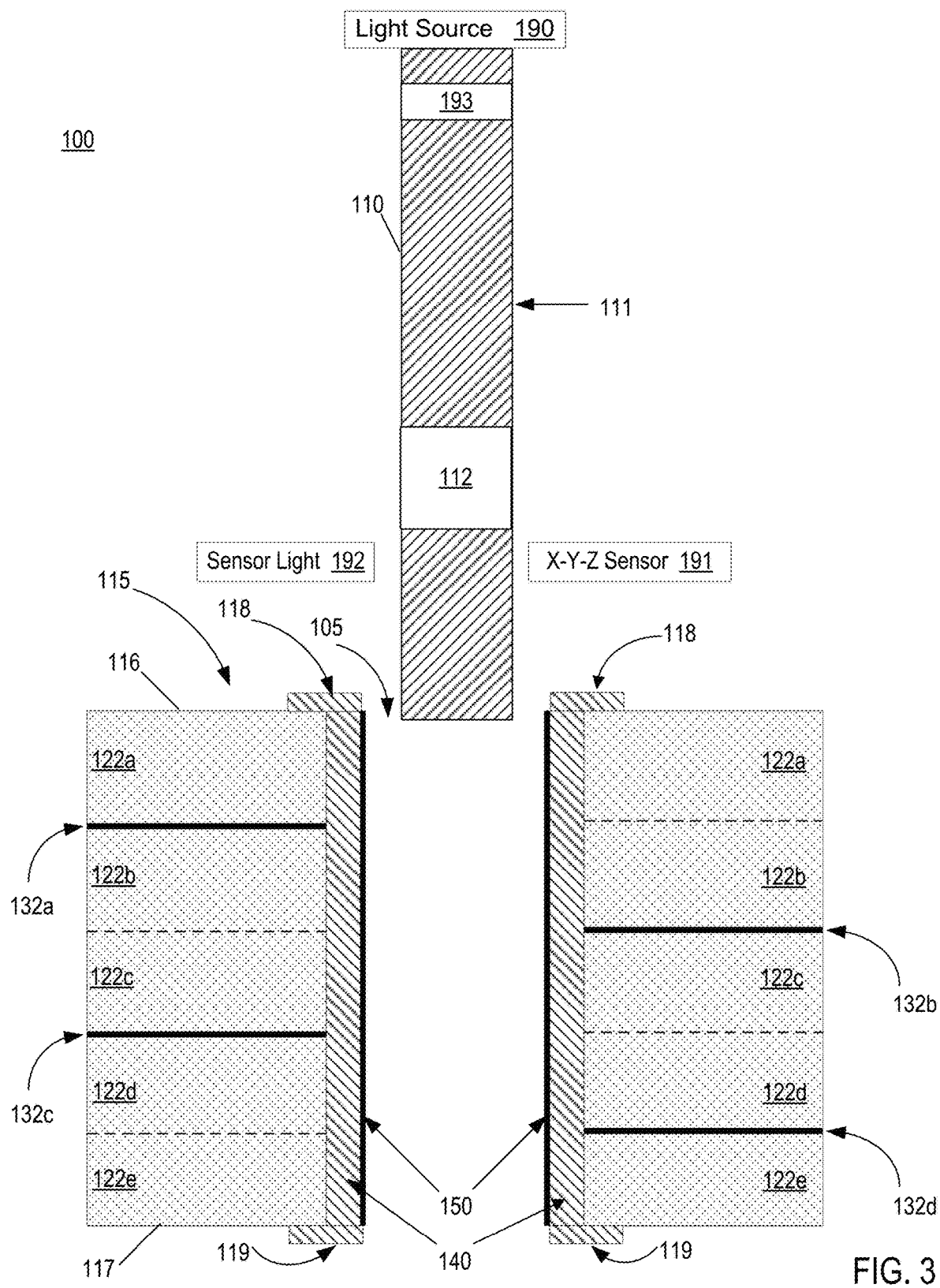
FIG. 3 is a diagram illustrating a system for creating in-via routing with a light pipe according to embodiments of the present invention.

FIG. 3 illustrates a system (100) configured for creating in-via routing with a light pipe according to embodiments of the present invention. FIG. 3 continues the example illustrated in FIG. 1 in that FIG. 3 also includes the via (105) that is a drilled through-hole from an annular conductive pad (118) on a top exposed surface (116) to an annular conductive pad (119) on a bottom exposed surface (117). The top surface (116) and bottom surface (117) of the PCB may have formed thereon conductive traces connecting to the conductive pads (118, 119). The interior of the PCB (115) includes wiring planes in which the electrically conductive traces (132a, 132b, 132c, 132d) are formed, and which are separated by insulating layers (122a, 122b, 122c, 122d, 122e) comprised of an insulating material. Via (105) intersects the traces (132a, 132b, 132c, 132d) and is lined with a conductive material (140) thereby forming a conductive conduit that may connect some or all of the traces (132a, 132b, 132c, 132d). In addition, a resist layer (150) is applied to the surface of the conductive material (140) in the via (105). In some embodiments of the present disclosure, the resist layer (150) is comprised of a positive photoresist material that is degraded by exposure to light.

Further, the system of FIG. 3 includes a masked light pipe (110) (not drawn to scale) coupled to a light source (190) capable of transmitting high energy light through the light pipe (110). The light pipe (110) includes a masked portion (112), which is opaque to inhibit the passage of light, and unmasked portion (111) through which light is freely transmitted from the light pipe. The light source (190) may be, for example, a laser. Although not drawn to scale, it may be ascertained from FIG. 3 that the light pipe may be inserted into the via (105).

Further, the system of FIG. 3 includes a sensor light source (192) and sensor detector that are perpendicular to the light pipe (110). When the light pipe (110) is inserted into the via (105), light from the sensor light source (192) passes through an unmasked region (193) of the light pipe and is detected by the sensor detector (191) to ascertain the exact position X, Y, and Z position of the light pipe (110) in the via (105). That is, the yaw, tilt, and pitch of the light pipe (110) within the via (105) may be controlled through feedback from the sensor detector (191), for example, by a mechanical controller (not shown).

Figure 4:
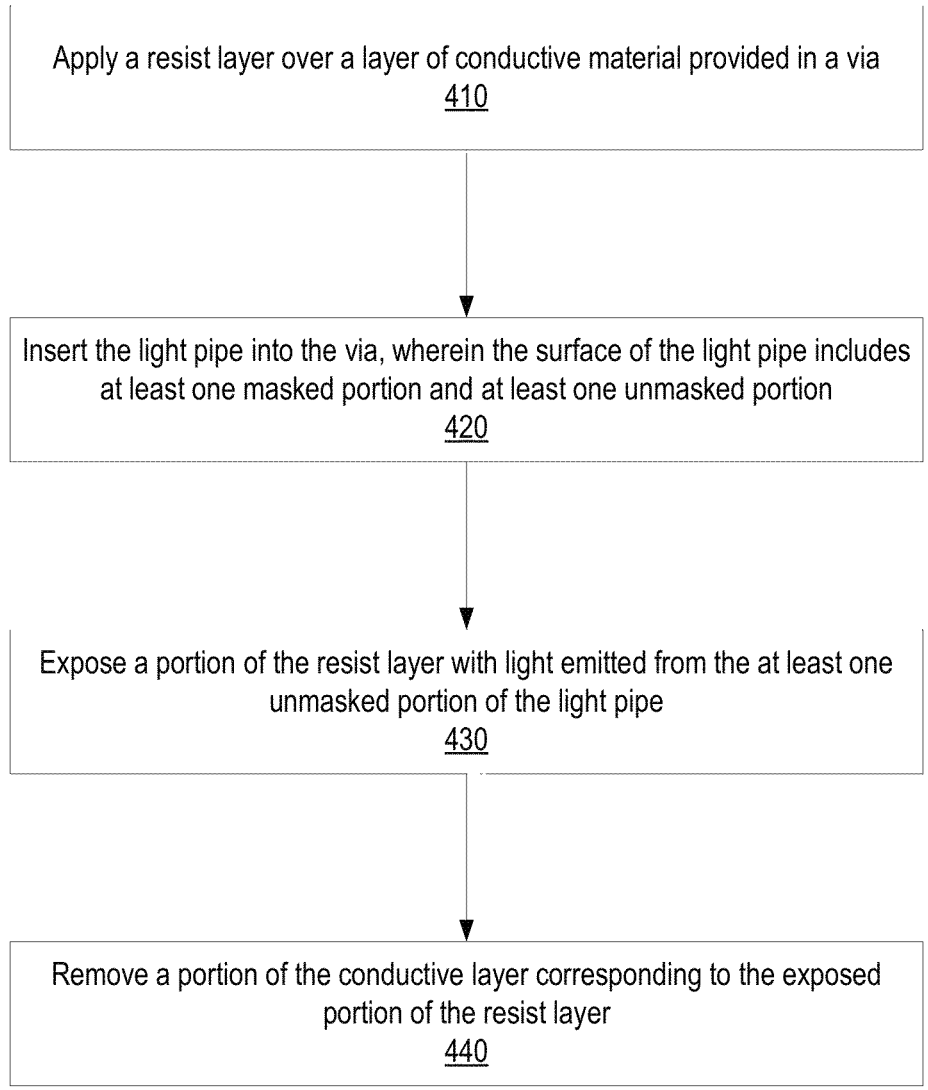
FIG. 4 is a flow chart illustrating a method for creating in-via routing with a light pipe according to embodiments of the present invention.

For further explanation, FIG. 4 sets forth a flow chart illustrating an exemplary method for creating in-via routing with a light pipe according to embodiments of the present invention that includes applying a resist layer over a layer of conductive material provided in a via (410), inserting the light pipe into the via, wherein the surface of the light pipe includes at least one masked portion and at least one unmasked portion (420), exposing a portion of the resist layer with light emitted from the at least one unmasked portion of the light pipe (430), and removing a portion of the conductive layer corresponding to the exposed portion of the resist layer (440).

Figure 5:
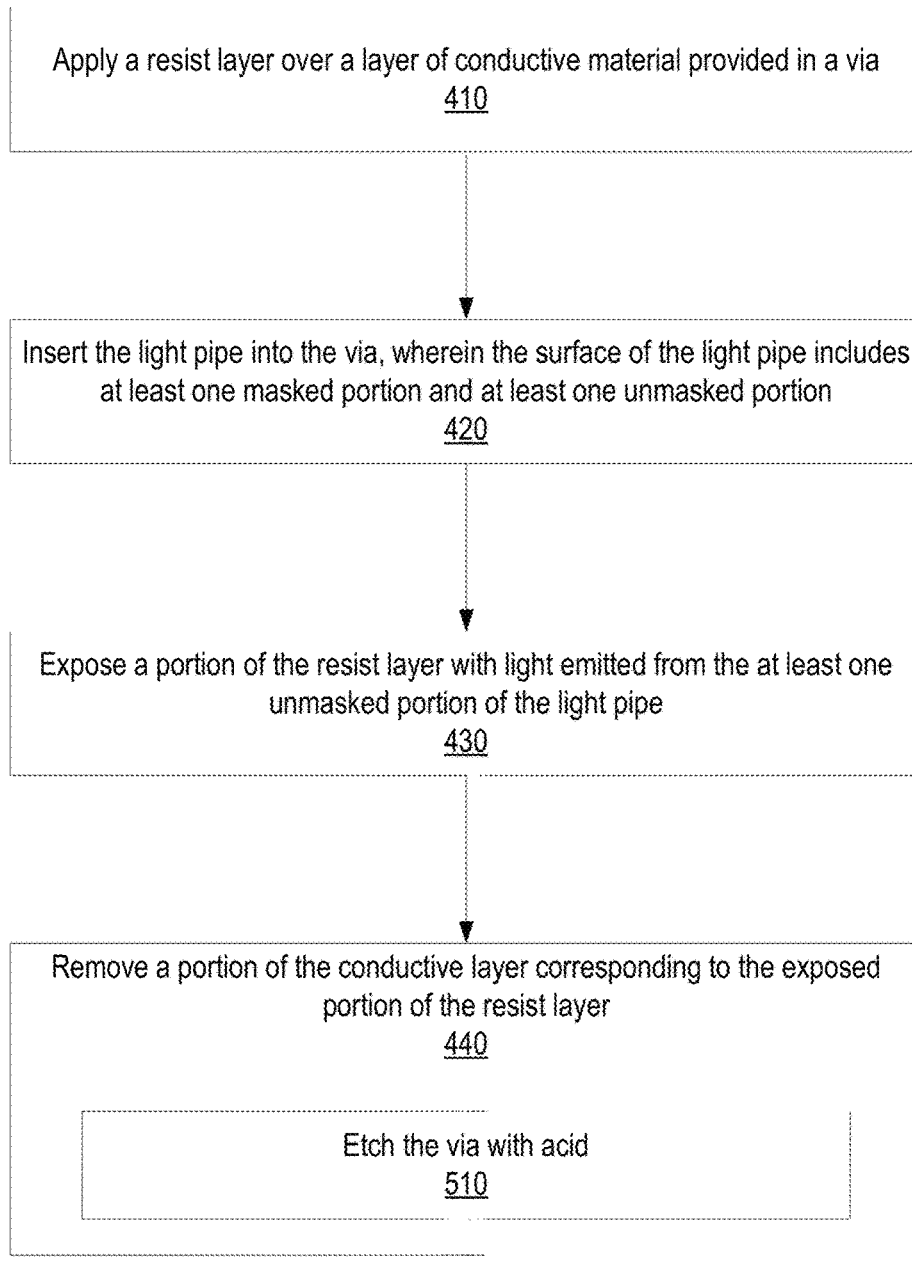
FIG. 5 is a flow chart illustrating a method for creating in-via routing with a light pipe according to embodiments of the present invention.

For further explanation, FIG. 5 sets forth a flow chart illustrating an exemplary method for creating in-via routing with a light pipe according to embodiments of the present invention FIG. 5 is similar to FIG. 4 in that it includes applying a resist layer over a layer of conductive material provided in a via (410), inserting the light pipe into the via, wherein the surface of the light pipe includes at least one masked portion and at least one unmasked portion (420), exposing a portion of the resist layer with light emitted from the at least one unmasked portion of the light pipe (430), and removing a portion of the conductive layer corresponding to the exposed portion of the resist layer (440).

In the example of FIG. 5, removing a portion of the conductive layer corresponding to the exposed portion of the resist layer (440) additionally includes etching (510) the via with acid or the like to remove the copper that lies underneath the exposed portions of the resist layer.

Figure 6:
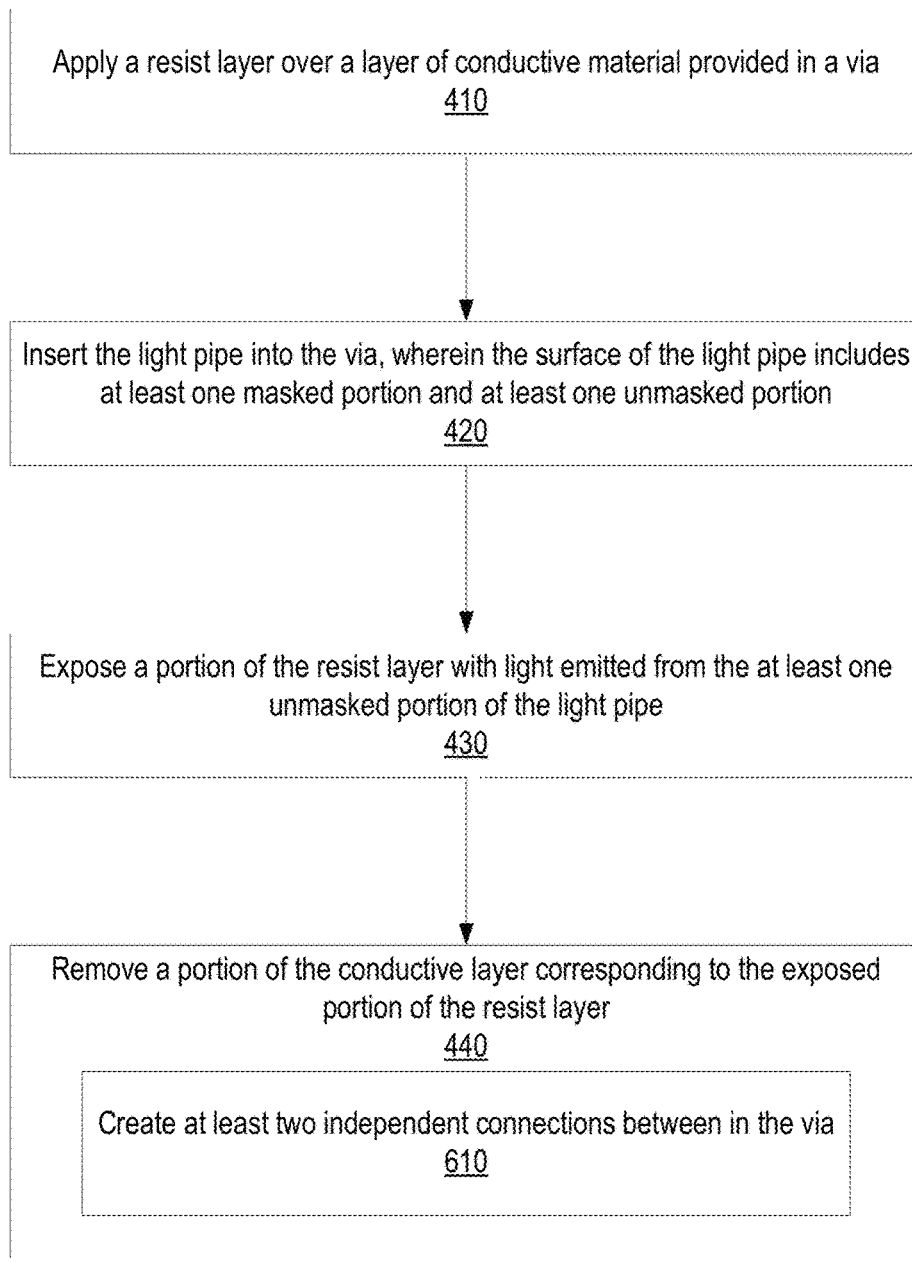
FIG. 6 is a flow chart illustrating a method for creating in-via routing with a light pipe according to embodiments of the present invention.

For further explanation, FIG. 6 sets forth a flow chart illustrating an exemplary method for creating in-via routing with a light pipe according to embodiments of the present invention FIG. 6 is similar to FIG. 4 in that it includes applying a resist layer over a layer of conductive material provided in a via (410), inserting the light pipe into the via, wherein the surface of the light pipe includes at least one masked portion and at least one unmasked portion (420), exposing a portion of the resist layer with light emitted from the at least one unmasked portion of the light pipe (430), and removing a portion of the conductive layer corresponding to the exposed portion of the resist layer (440).

In the example of FIG. 6, removing a portion of the conductive layer corresponding to the exposed portion of the resist layer (440) additionally includes creating at least two independent connections between in the via (610) by removal of the intervening conductive material.

Figure 7:
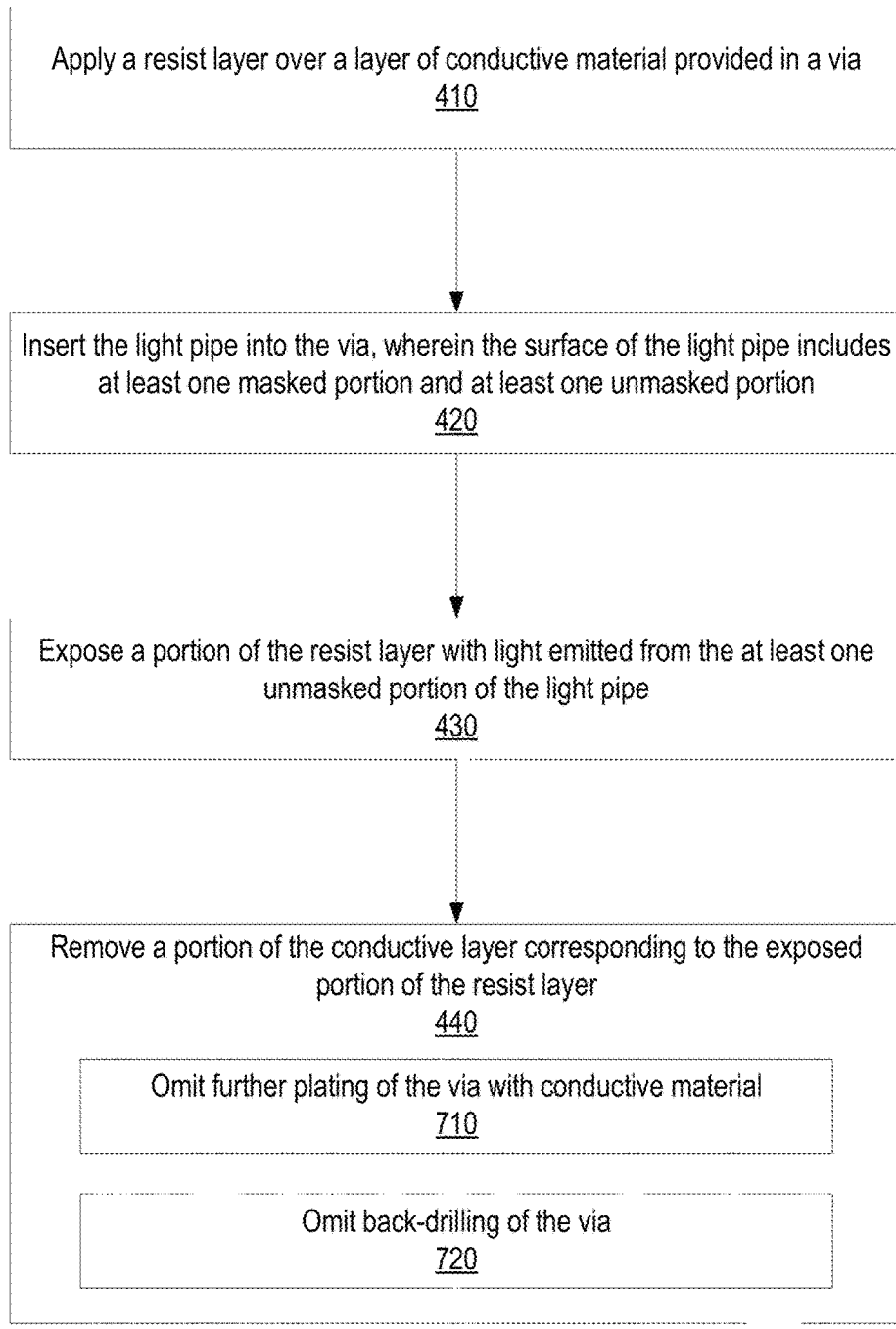
FIG. 7 is a flow chart illustrating a method for creating in-via routing with a light pipe according to embodiments of the present invention.

For further explanation, FIG. 7 sets forth a flow chart illustrating an exemplary method for creating in-via routing with a light pipe according to embodiments of the present invention FIG. 7 is similar to FIG. 4 in that it includes applying a resist layer over a layer of conductive material provided in a via (410), inserting the light pipe into the via, wherein the surface of the light pipe includes at least one masked portion and at least one unmasked portion (420), exposing a portion of the resist layer with light emitted from the at least one unmasked portion of the light pipe (430), and removing a portion of the conductive layer corresponding to the exposed portion of the resist layer (440).

In the example of FIG. 7, removing a portion of the conductive layer corresponding to the exposed portion of the resist layer (440) additionally includes omitting any further plating of the via (710) and/or omitting any further mechanical processing of the via (720) such as back-drilling. Additional plating and/or back-drilling of the via may be omitted by virtue of the light pipe technology used to create the in-via routing.

Figure 8:
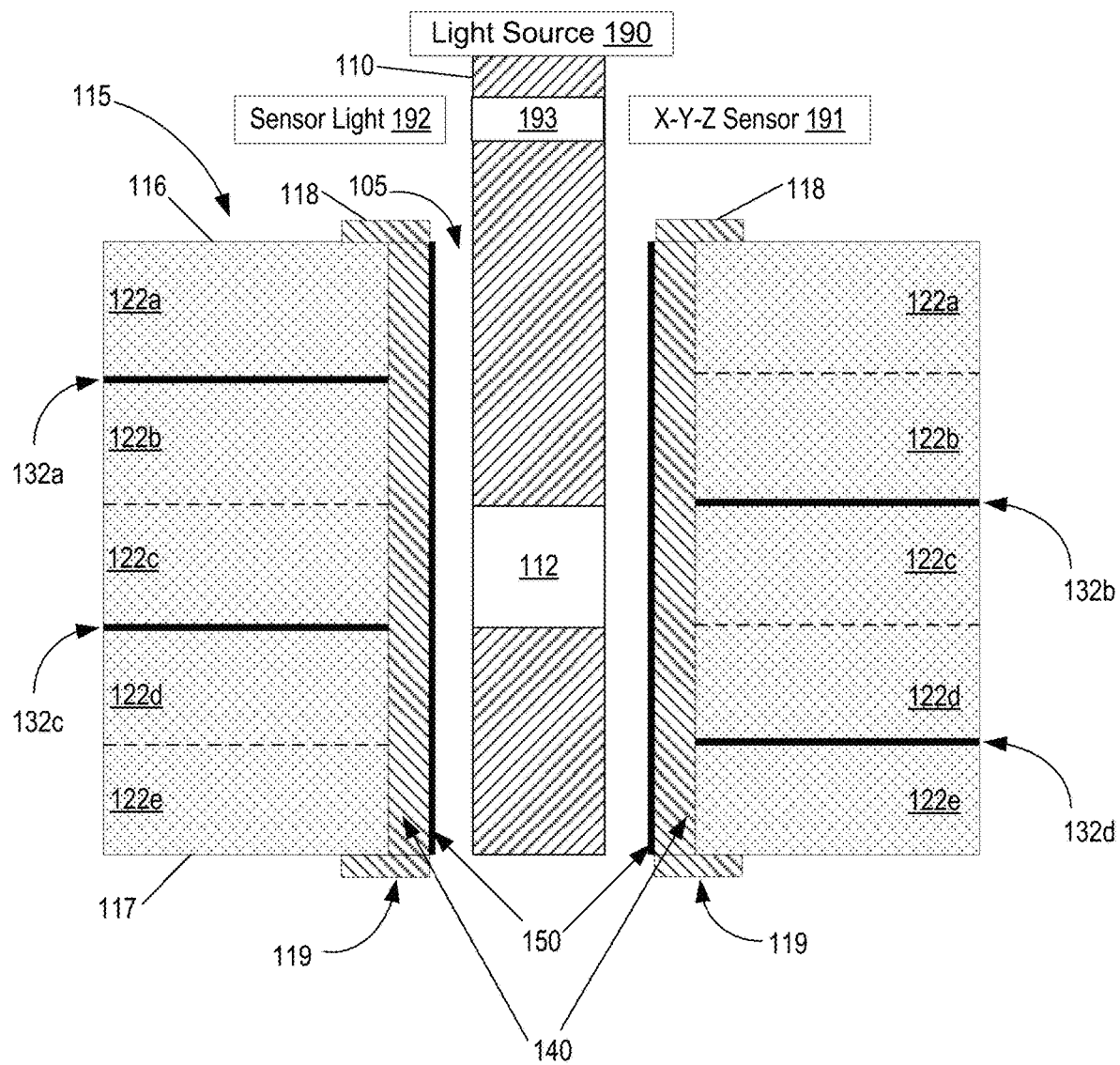
FIG. 8 is a diagram illustrating a cross-sectional view of creating a testable split via by in-via routing with a light pipe according to embodiments of the present invention.

For further explanation, FIG. 8 sets forth a diagram illustrating a further exemplary system for creating in-via routing with a light pipe according to embodiments of the present invention. Continuing the example shown in FIG. 3, FIG. 8 includes the PCB (115), the light pipe (110), and the light source (190), which are not drawn to scale in FIG. 8. Via (105) is a drilled through-hole from an annular conductive pad (118) on a top exposed surface (116) to an annular conductive pad (119) on a bottom exposed surface (117). The top surface (116) and bottom surface (117) of the PCB may have formed thereon conductive traces connecting to the conductive pads (118, 119). The interior of the PCB (115) includes wiring planes in which the electrically conductive traces (132a, 132b, 132c, 132d) are formed, and which are separated by insulating layers (122a, 122b, 122c, 122d, 122e) comprised of an insulating material. Via (105) intersects the traces (132a, 132b, 132c, 132d) and is lined with a conductive material (140) thereby forming a conductive conduit that may connect some or all of the traces (132a, 132b, 132c, 132d). The resist layer (150) is applied to the surface of the conductive material (140) in the via (105). In the example of FIG. 8, insertion (420) of the light pipe (110) into the via (105) is illustrated.

Further, the system of FIG. 8 includes a sensor light source (192) and sensor detector that are perpendicular to the light pipe (110). When the light pipe (110) is inserted into the via (105), light from the sensor light source (192) passes through an unmasked region (193) of the light pipe and is detected by the sensor detector (191) to ascertain the exact position X, Y, and Z position of the light pipe (110) in the via (105). That is, the yaw, tilt, and pitch of the light pipe (110) within the light pipe may be controlled through feedback from the sensor detector (191), for example, by a mechanical controller (not shown).

Figure 9:
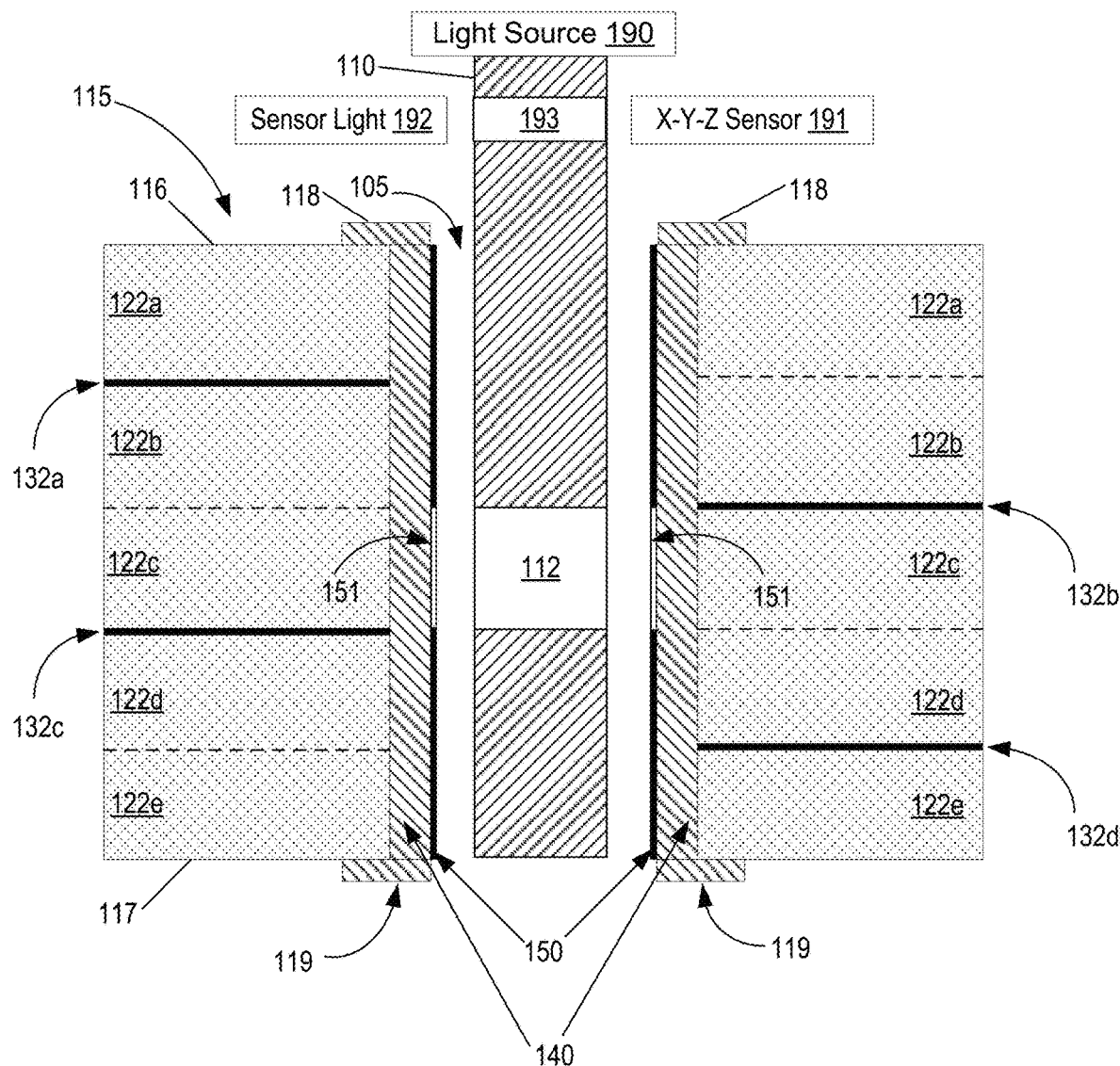
FIG. 9 is a diagram illustrating a cross-sectional view of creating a testable split via by in-via routing with a light pipe according to embodiments of the present invention.

For further explanation, FIG. 9 sets forth a diagram illustrating a further exemplary system for creating in-via routing with a light pipe according to embodiments of the present invention. Continuing the example shown in FIG. 8, FIG. 9 illustrates exposure (430) portions of the resist layer (151) to high energy light transmitted from the unmasked portions (112) of the light pipe (110) from activation of the light source (190).

Figure 10:
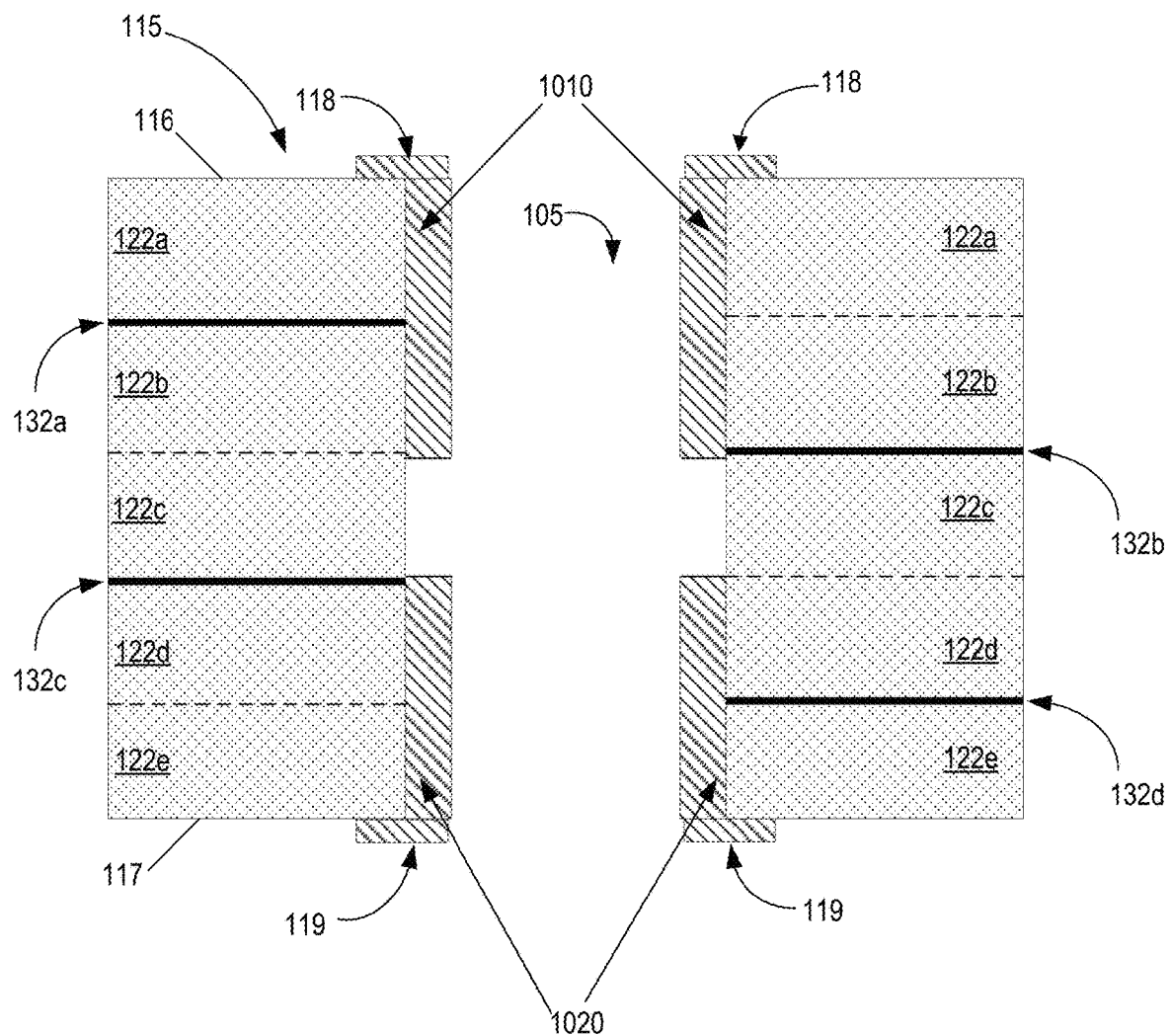
FIG. 10 is a diagram illustrating a cross-sectional view of a testable split via created by in-via routing with a light pipe according to embodiments of the present invention.

For further explanation, FIG. 10 sets forth a diagram illustrating a further exemplary system for creating in-via routing with a light pipe according to embodiments of the present invention. Continuing the example shown in FIG. 9, FIG. 10 illustrates the removal (440) of the conductive material (140) corresponding to the exposed portions (151) of the resist layer. In some embodiments of the present disclosure, the removal (440) of the conductive material (140) may be an etching process (510) from the application of acid to the via (105). After the removal (440) of the conductive material (140), it can be seen that an electric connection (1010) is made between the top (116) of PCB (115), the conductive trace A (132a), and the conductive trace B (132b) through a first portion of the remaining conductive material (140). A second and independent electrical connection (1020) is made between the bottom (117) of PCB (115), conductive trace C (132c), and conductive trace D (132d) through a second remaining portion of the conductive material.

Figure 11:
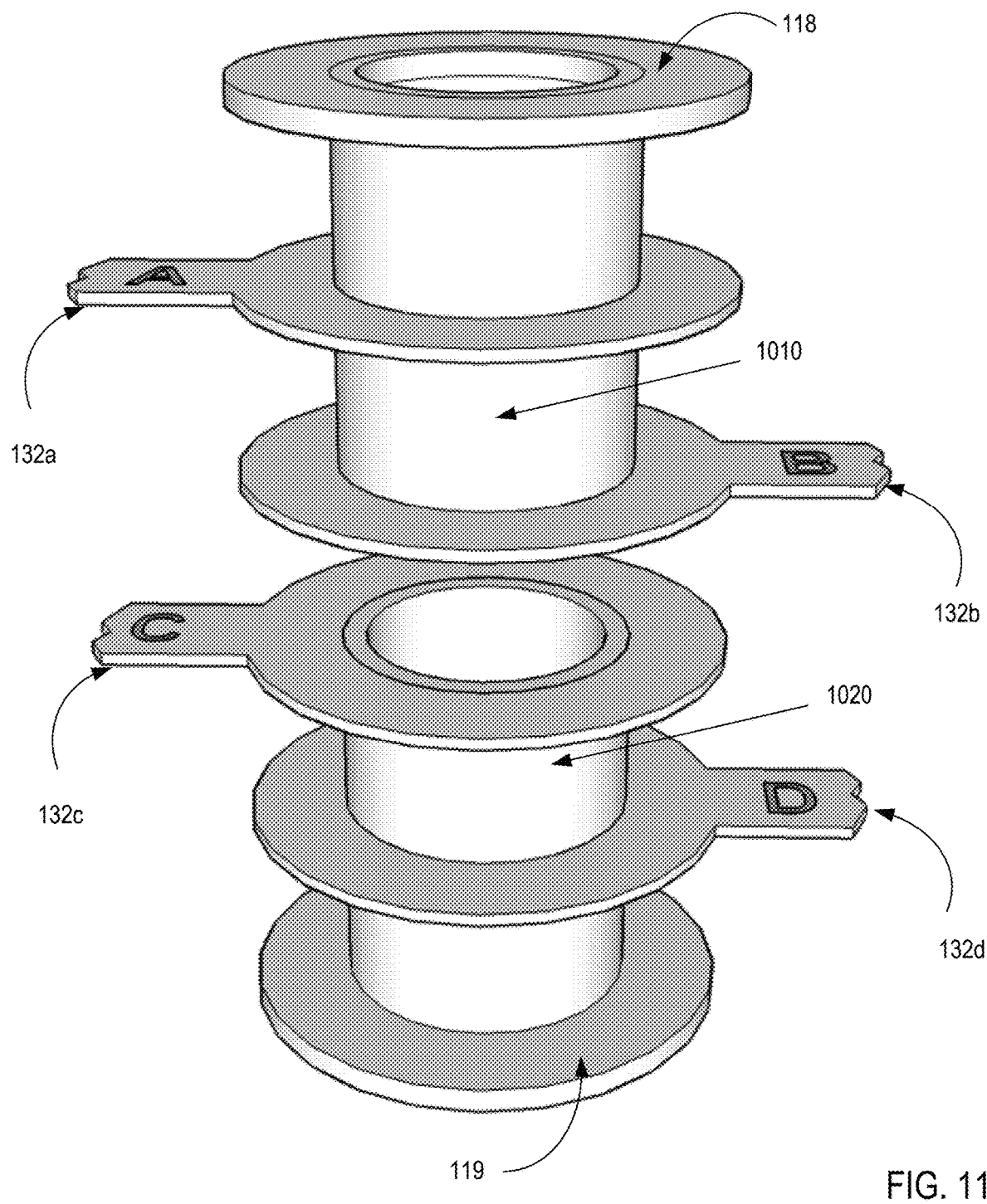
FIG. 11 is a diagram illustrating a 3-dimensional view of a testable split via created by in-via routing with a light pipe according to embodiments of the present invention.

For further explanation, continuing the example of FIG. 10, FIG. 11 sets forth an exemplary diagram illustrating a three-dimensional perspective view of the in-via routing achieved in the example of FIG. 10 by the independent electrical connections (1010, 1020). In the example of FIG. 11, traces (132a, 132b, 132c, 132d) are shown with the insulating layers (122a, 122b, 122c, 122d, 122e) omitted for clarity. In the example of FIG. 11, the connections (1010, 1020) are testable from the conductive pads (118, 119) respectively. Stubs of conductive material connecting the top pad (118) to trace A (132a) and the bottom pad (119) to trace D (132d) have not been removed, thus certain parasitic factors caused by that material may exist.

Figure 12:
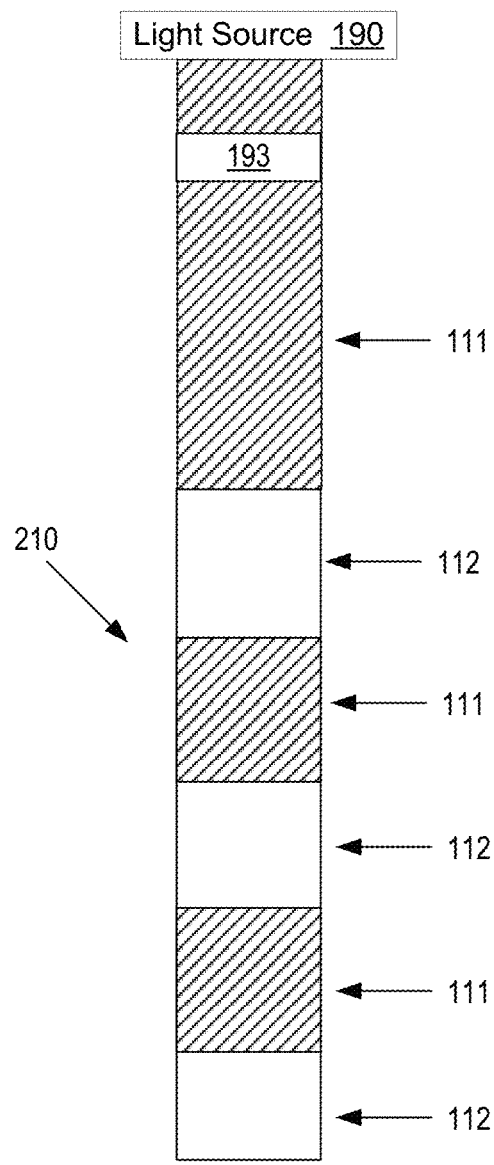
FIG. 12 is a diagram illustrating a masked light pipe for creating in-via routing according to embodiments of the present invention.

FIG. 12 illustrates a masked light pipe (210) (not drawn to scale) in accordance with another embodiment of the present disclosure. As in the example of FIG. 3, the masked light pipe (210) includes a masked portion (111), which is opaque to inhibit the passage of light, and unmasked portion (112) through which light from light source (190) is freely transmitted from the light pipe. Masked light pipe (210) further includes an unmasked region (193) for use with the position detection sensors previously described.

Figure 13:
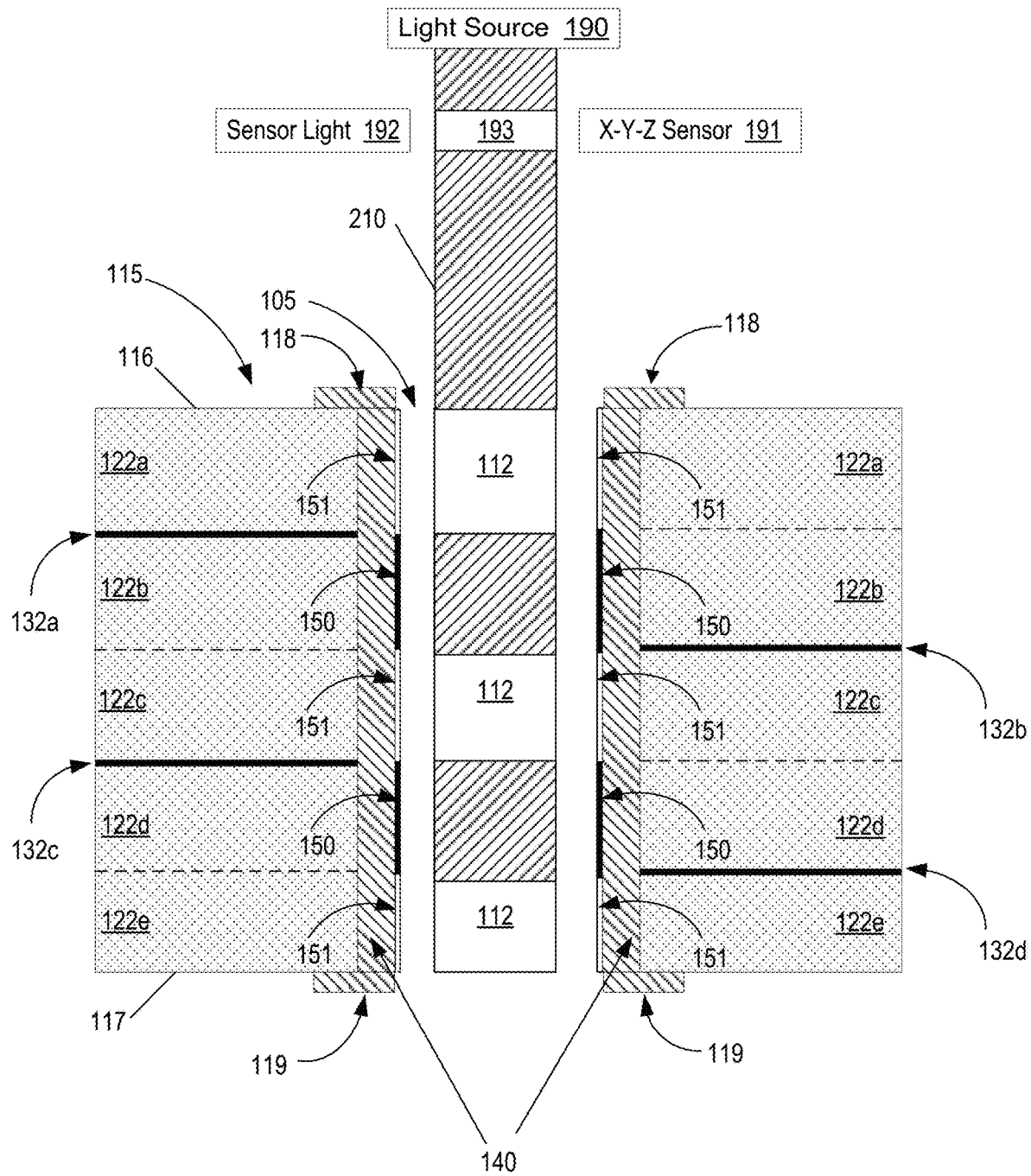
FIG. 13 is a diagram illustrating a cross-sectional view of the creation of an untestable split via by in-via routing with a light pipe according to embodiments of the present invention.

For further explanation, FIG. 13 is a diagram illustrating a further exemplary system for creating in-via routing with a light pipe according to embodiments of the present invention. Continuing the example in FIG. 8 using the light pipe (210) of FIG. 12, FIG. 13 illustrates insertion (420) of the light pipe (210) of FIG. 12 into the via (105), and exposure (430) of portions the resist layer (1351) to high energy light transmitted from the unmasked portions (112) of the light pipe (210) from activation of the light source (190).

Further, the system of FIG. 13 includes a sensor light source (192) and sensor detector that are perpendicular to the light pipe (110). When the light pipe (110) is inserted into the via (105), light from the sensor light source (192) passes through an unmasked region (193) of the light pipe and is detected by the sensor detector (191) to ascertain the exact position X, Y, and Z position of the light pipe (110) in the via (105). That is, the yaw, tilt, and pitch of the light pipe (110) within the light pipe may be controlled through feedback from the sensor detector (191), for example, by a mechanical controller (not shown).

Figure 14:
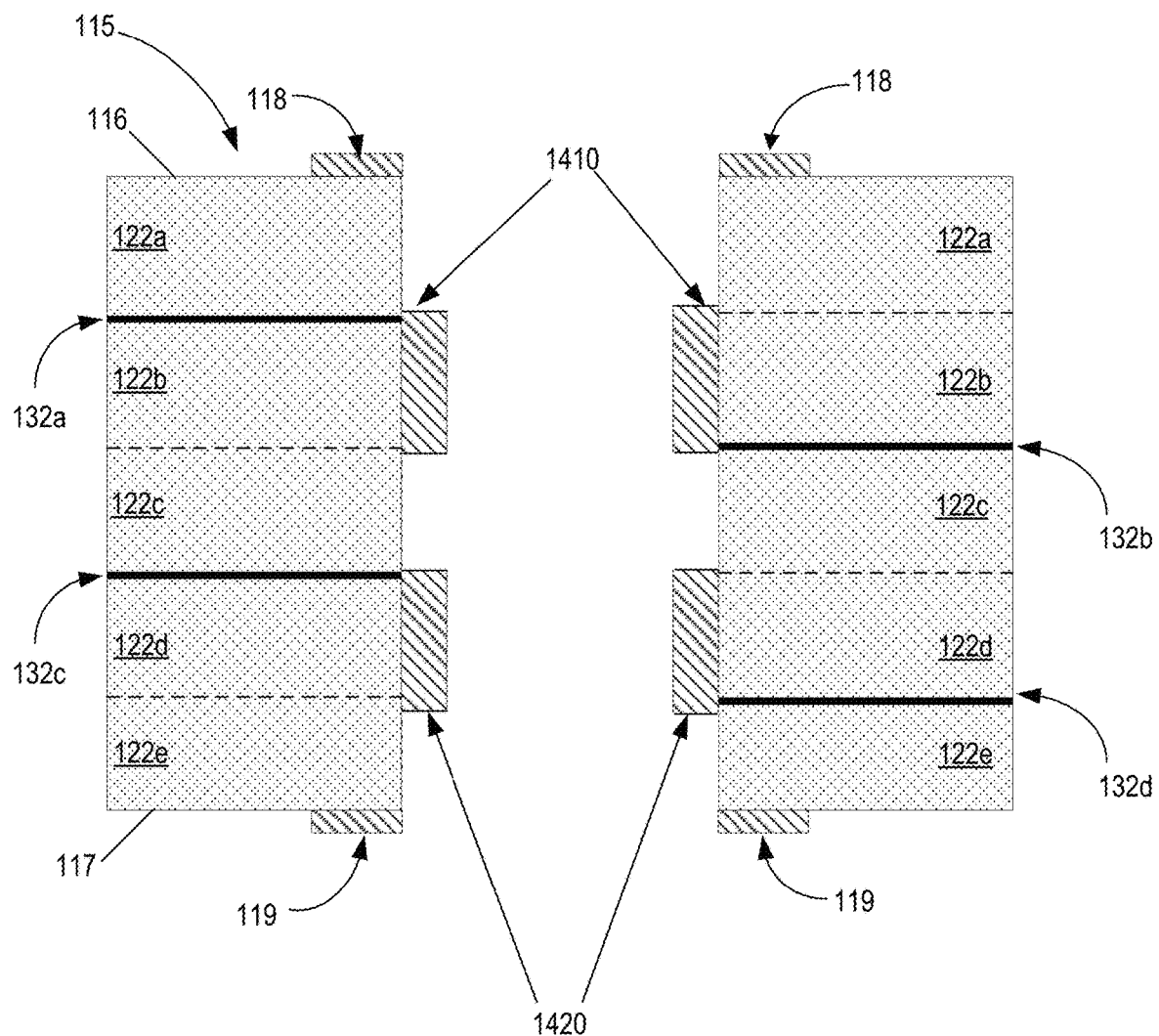
FIG. 14 is a diagram illustrating a cross-sectional view of an untestable split via created by in-via routing with a light pipe according to embodiments of the present invention.

For further explanation, FIG. 14 sets forth a diagram illustrating a further exemplary system for creating in-via routing with a light pipe according to embodiments of the present invention. Continuing the example shown in FIG. 13, FIG. 14 illustrates the removal (440) of the conductive material (140) corresponding to the exposed portions (1351) of the resist layer. After the removal (440) of the conductive material (140), it can be seen that an electric connection (1410) is made the conductive trace A (132a), and the conductive trace B (132b) through a first portion of the remaining conductive material (140). A second and independent electrical connection (1420) is made between conductive trace C (132c), and conductive trace D (132d) through a second remaining portion of the conductive material (140). The resulting in-via routing created by the independent connections (1410, 1420) is blind in that it cannot be tested from the top and bottom surfaces (116, 117) of the PCB (115) by conductive pads (118, 119).

Figure 15:
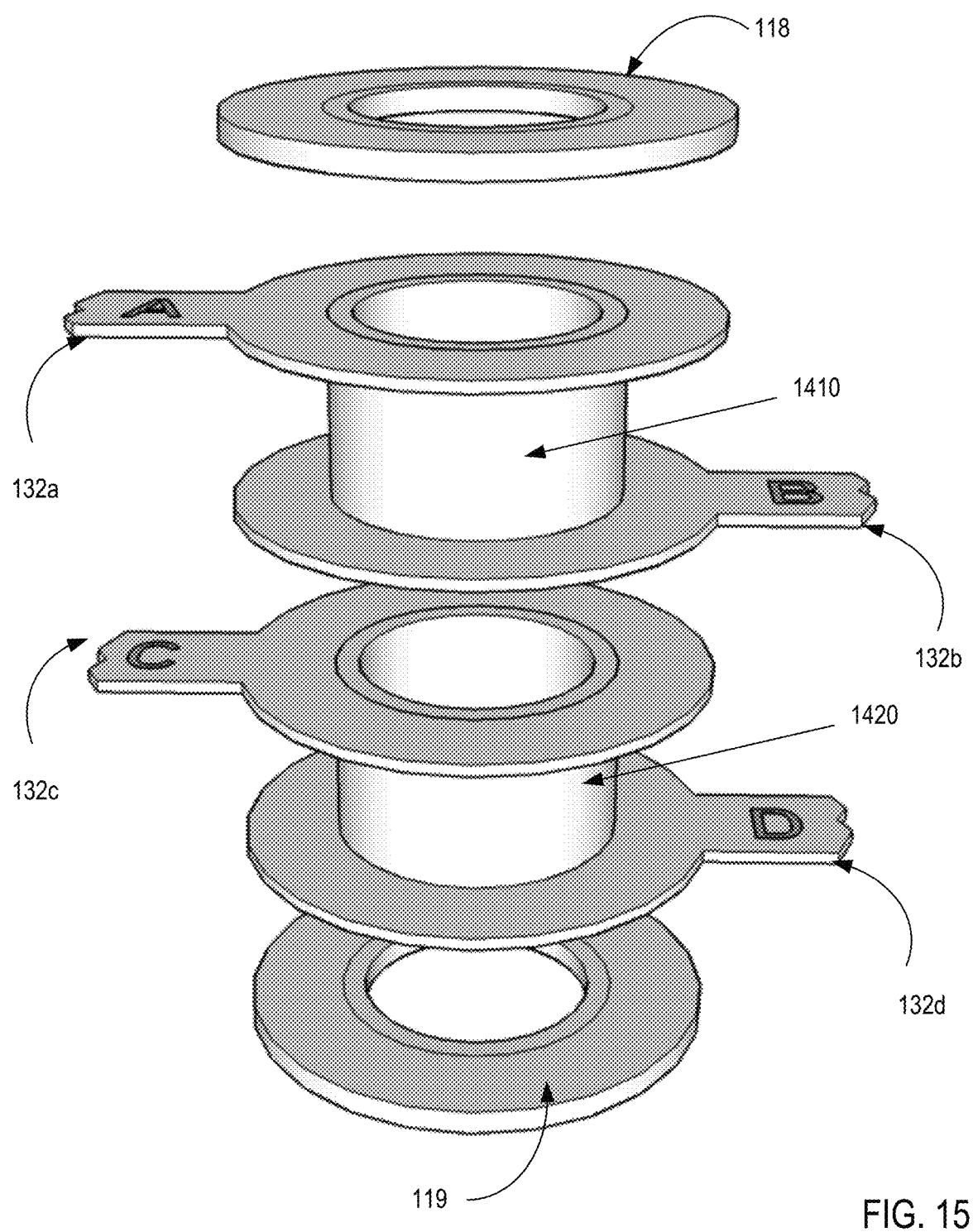
FIG. 15 is a diagram illustrating a 3-dimensional view of an untestable split via created by in-via routing with a light pipe according to embodiments of the present invention.

For further explanation, continuing the example of FIG. 14, FIG. 15 sets forth an exemplary diagram illustrating a three-dimensional perspective view of the in-via routing achieved in the example of FIG. 14 by the independent electrical connections (1410, 1420). In the example of FIG. 15, traces (132a, 132b, 132c, 132d) are shown with the insulating layers (122a, 122b, 122c, 122d, 122e) omitted for clarity. In the example of FIG. 11, the connections (1410, 1420) are not testable from the conductive pads (118, 119) respectively. Stubs of conductive material connecting the top pad (118) to trace A (132a) and the bottom pad (119) to trace D (132d) have been removed, thus eliminating parasitic factors caused by that material.

Figure 16:
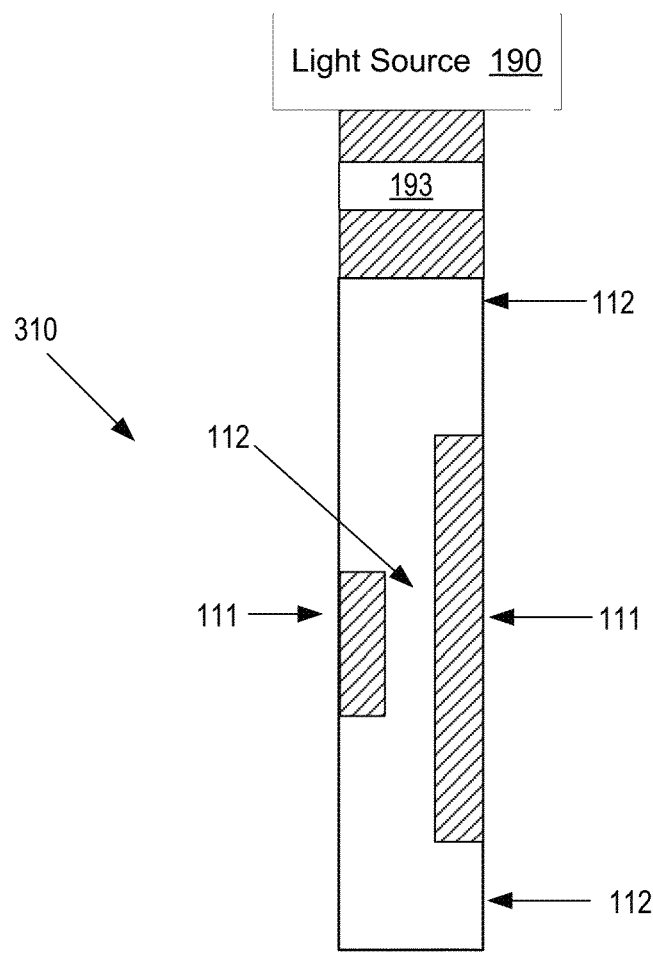
FIG. 16 is a diagram illustrating a masked light pipe for creating in-via routing according to embodiments of the present invention.

FIG. 16 illustrates a masked light pipe (310) (not drawn to scale) in accordance with another embodiment of the present disclosure. As in the example of FIG. 3, the masked light pipe (310) includes masked portions (111), which are opaque to inhibit the passage of light, and unmasked portions (112) through which light from light source (190) is freely transmitted from the light pipe. Masked light pipe (310) further includes an unmasked region (193) for use with the position detection sensors previously described.

Figure 17:
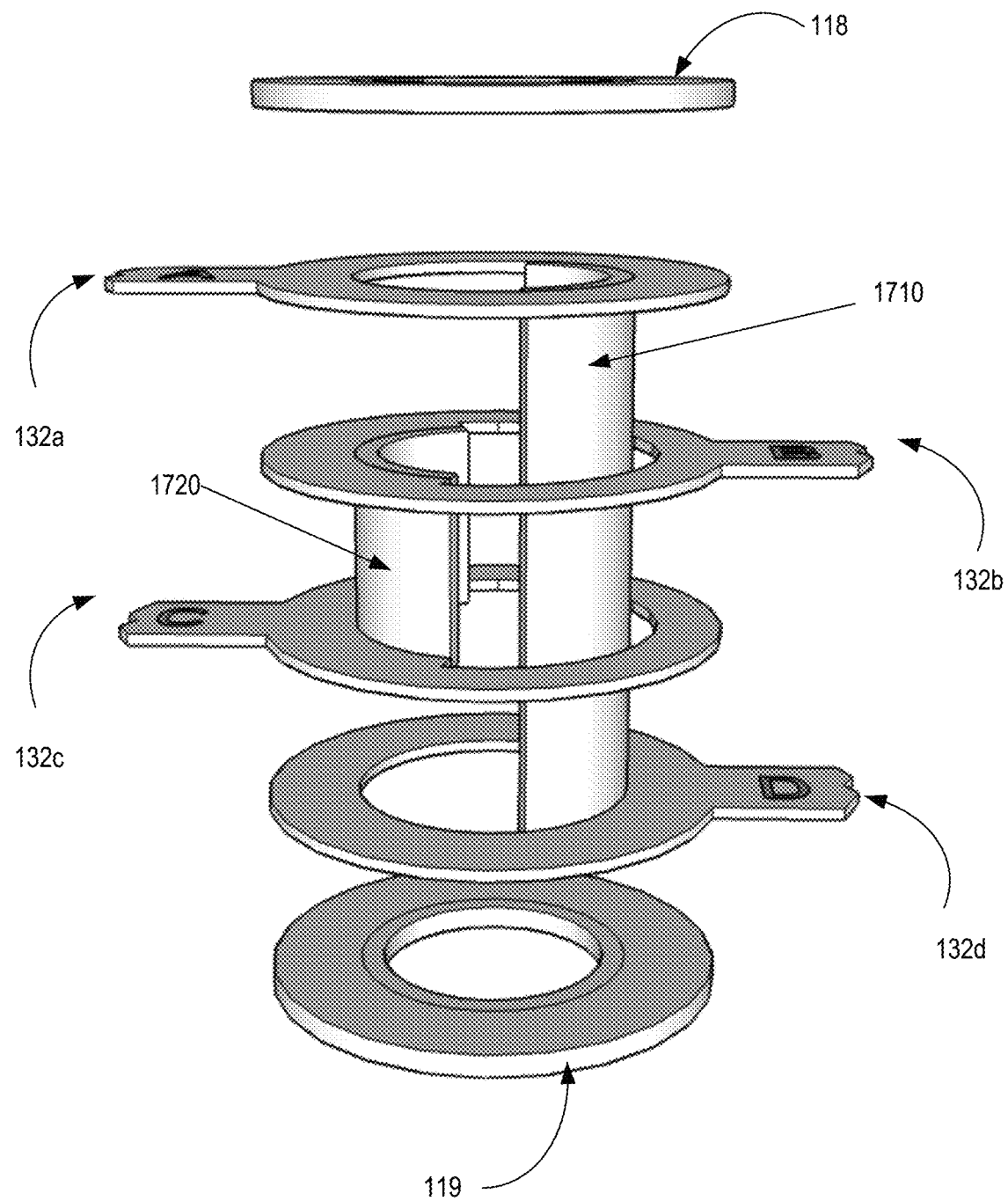
FIG. 17 is a diagram illustrating a 3-dimensional view of a via with non-adjacent in-via routing created with a light pipe according to embodiments of the present invention.

For further explanation, FIG. 17 sets forth an exemplary diagram illustrating a three-dimensional perspective view of the in-via routing achieved in using the light pipe (310) of FIG. 16 by independent electrical connections (1710, 1720). In the example of FIG. 17, traces (132a, 132b, 132c, 132d) are shown with the insulating layers (122a, 122b, 122c, 122d, 122e) omitted for clarity. The conductive traces C and B (132b, 132c) do not fully surround the via (105), thus allowing the first independent connection (1710) between non-adjacent traces A and D (132a, 132d), and a second independent connection (1720) between adjacent traces B and C (132b, 132c). Stubs of conductive material connecting the top pad (118) to trace A (132a) and the bottom pad (119) to trace D (132d) have been removed, thus eliminating parasitic factors caused by that material. The additional removal of conductive material from the sidewalls of the via (105) further reduces parasitics in the via.

Figure 18:
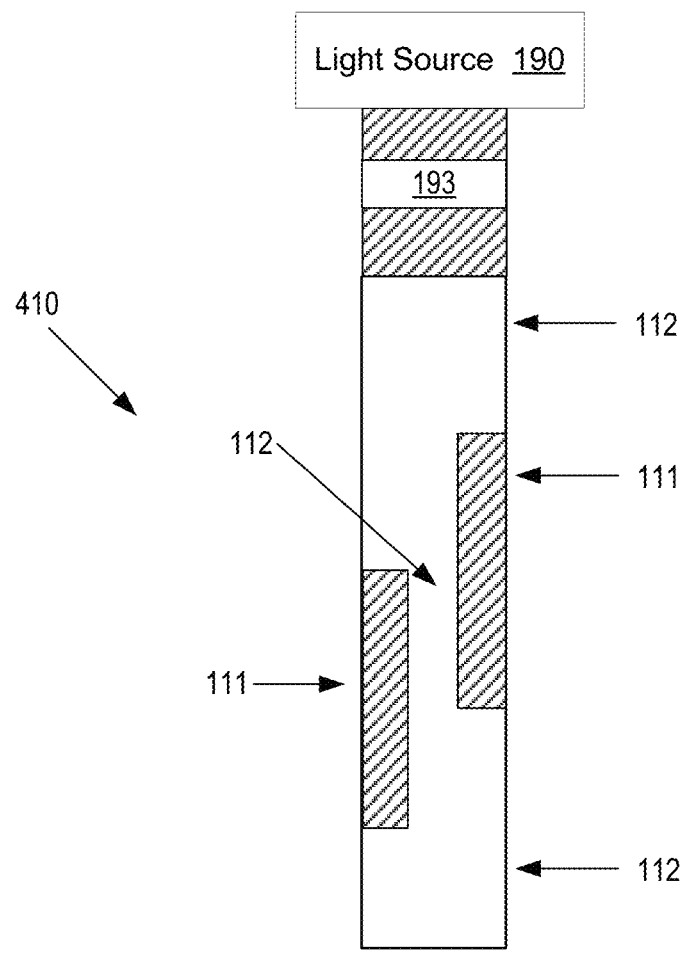
FIG. 18 is a diagram illustrating a masked light pipe for creating in-via routing according to embodiments of the present invention.

FIG. 18 illustrates a masked light pipe (410) (not drawn to scale) in accordance with another embodiment of the present disclosure. As in the example of FIG. 3, the masked light pipe (410) includes masked portions (111), which are opaque to inhibit the passage of light, and unmasked portions (112) through which light from light source (190) is freely transmitted from the light pipe. Masked light pipe (410) further includes an unmasked region (193) for use with the position detection sensors previously described.

Figure 19:
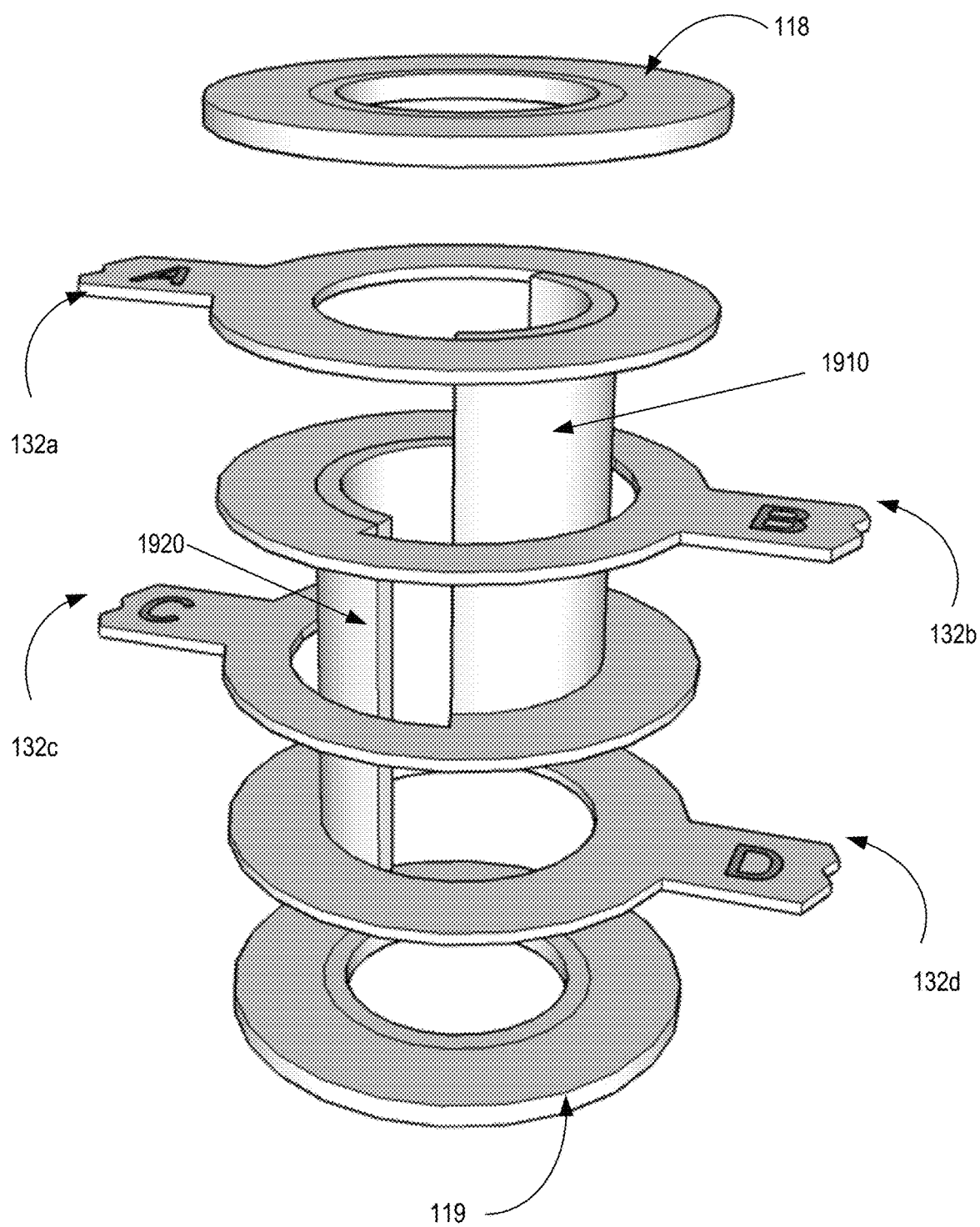
FIG. 19 is a diagram illustrating a 3-dimensional view of a via with non-adjacent in-via routing created with a light pipe according to embodiments of the present invention.

For further explanation, FIG. 19 sets forth an exemplary diagram illustrating a three-dimensional perspective view of the in-via routing achieved in using the light pipe (310) of FIG. 16 by independent electrical connections (1910, 1920). In the example of FIG. 19, traces (132a, 132b, 132c, 132d) are shown with the insulating layers (122a, 122b, 122c, 122d, 122e) omitted for clarity. The conductive traces C and B (132b, 132c) do not fully surround the via (105), thus allowing the first independent connection (1910) between non-adjacent traces A and C (132a, 132c), and a second independent connection (1920) between adjacent traces B and D (132b, 132d).

Figure 20:
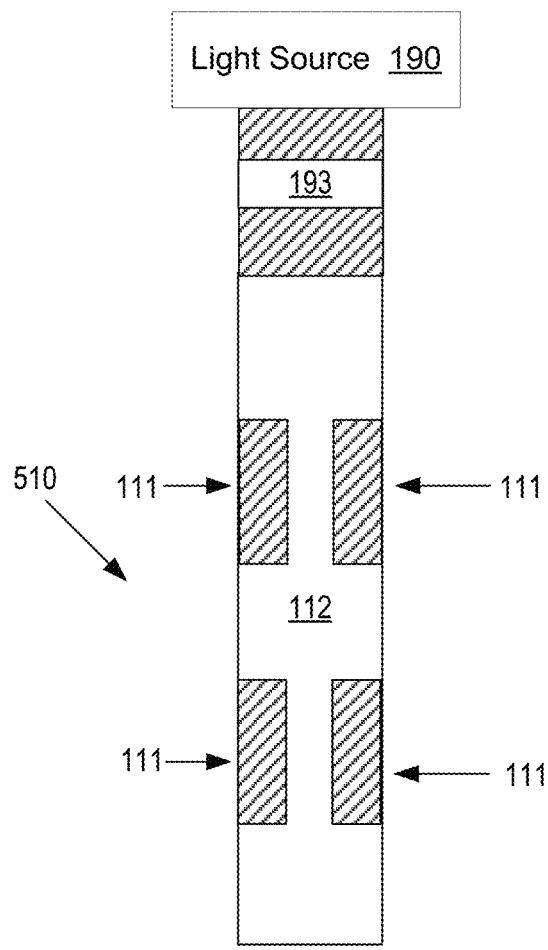
FIG. 20 is a diagram illustrating a masked light pipe for creating in-via routing according to embodiments of the present invention.

FIG. 20 illustrates a masked light pipe (510) (not drawn to scale) in accordance with another embodiment of the present disclosure. As in the example of FIG. 3, the masked light pipe (510) includes masked portions (111), which are opaque to inhibit the passage of light, and unmasked portions (112) through which light from light source (190) is freely transmitted from the light pipe. Masked light pipe (510) further includes an unmasked region (193) for use with the position detection sensors previously described.

Figure 21:
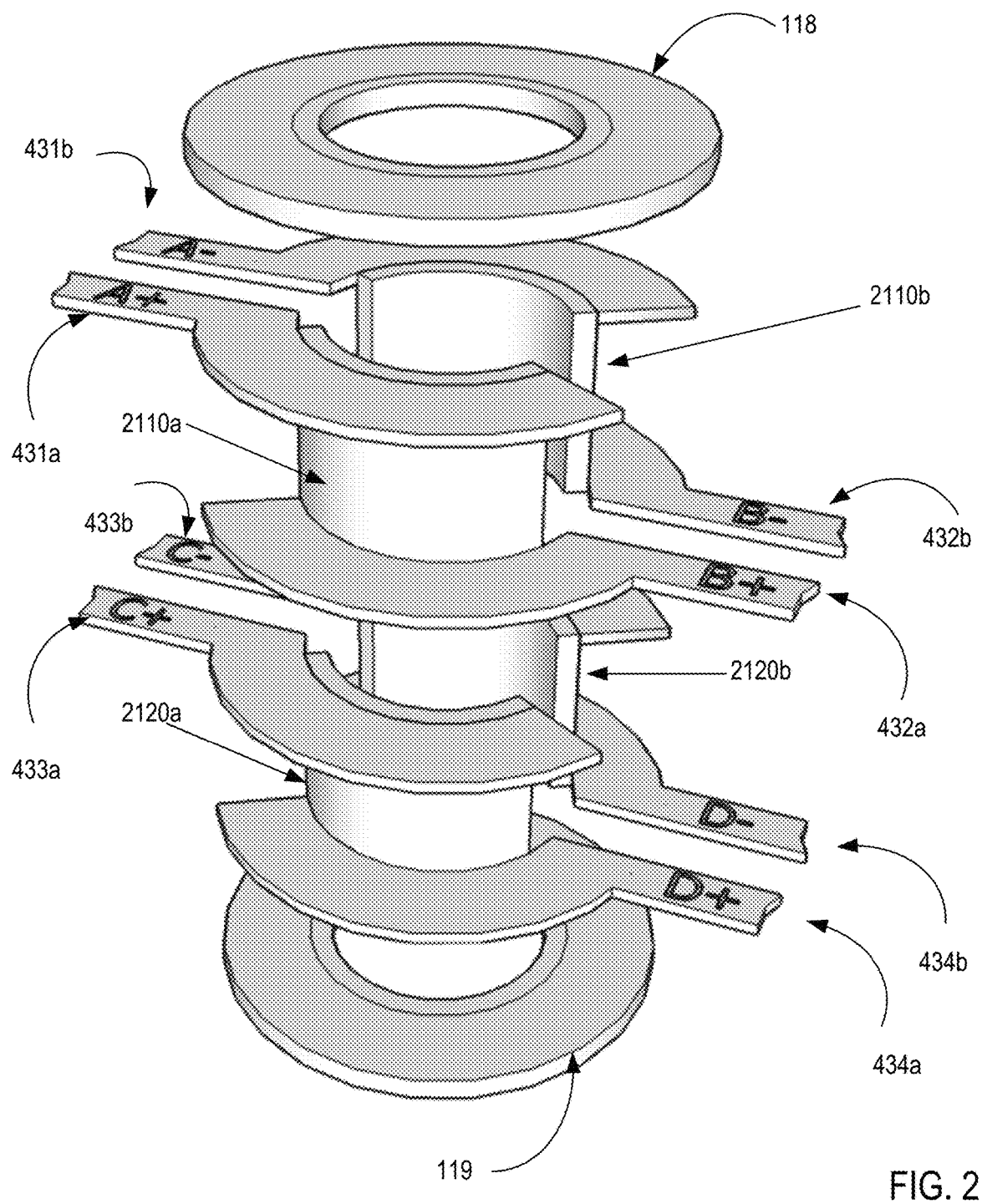
FIG. 21 is a diagram illustrating a 3-dimensional view of a via with in-via routing of differential traces created with a light pipe according to embodiments of the present invention.

For further explanation, FIG. 21 sets forth an exemplary diagram illustrating a three-dimensional perspective view of the in-via routing achieved in using the light pipe (510) of FIG. 20. It will be recognized that the perspective view of FIG. 21 is rotated 90 degrees relative to the view in FIG. 20.

In the example of FIG. 21, differential pairs of traces are shown. The wiring layers in the PCB include a first differential pair A+ and A− (431a, 431b), a second differential pair B+ and B− (432a, 432b), a third differential pair C+ and C− (433a, 433b), and a fourth differential pair D+ and D− (434a, 434b). In the example of FIG. 21, first differential pair A+ and A− (431a, 431b) and second differential pair B+ and B− (432a, 432b) are connected by a differential connection (2110a, 2210b). Third differential pair C+ and C− (433a, 433b) and fourth differential pair D+ and D− (434a, 434b) are connected by a second independent differential connection (2120a, 2120b). Insulating layers (122a, 122b, 122c, 122d, 122e) omitted for clarity.

In view of the explanations set forth above, readers will recognize that the benefits of creating in-via routing with a light pipe according to embodiments of the present invention include: multiple independent connections in a via without a second plating process or further mechanical processing such as back-drilling, a simpler process for the connection of non-adjacent wiring layers in a via, and a simpler process for the connection of differential traces in a via.

Unless otherwise noted, like reference numerals in the description and various figures indicate like components, materials, steps, or processes.

Exemplary embodiments of the present invention are described largely in the context of a fully functional computer system for creating in-via routing with a light pipe. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of creating in-via routing with a light pipe, the method comprising:
    applying a resist layer over a layer of conductive material provided in a via of a printed circuit board (PCB) comprising a plurality of PCB layers;
    inserting the light pipe into the via, wherein the surface of the light pipe includes at least one masked portion and at least one unmasked portion;
    exposing a portion of the resist layer with light emitted from the at least one unmasked portion of the light pipe; and
    removing a portion of the conductive layer corresponding to the exposed portion of the resist layer, wherein removing the portion of the conductor layer removes an electrical connection between at least two of the plurality of PCB layers, while intersecting at least two conductive traces.

2. The method of claim 1 wherein applying a resist layer over a layer of conductive material provided in a via includes providing the via, wherein the via has been plated with the conductive material.

3. The method of claim 1 wherein removing a portion of the conductive layer corresponding to the exposed portion of the resist layer includes etching the via with acid.

4. The method of claim 1 wherein the resist layer is a positive photoresist material.

5. The method of claim 1 wherein removing a portion of the conductive layer corresponding to the exposed portion of the resist layer includes creating at least two independent connections in the via.

6. The method of claim 1 wherein removing a portion of the conductive layer corresponding to the exposed portion of the resist layer includes removing a conductive stub between a conductive pad on a surface of the printed circuit board and a conductive trace in an interior layer of the printed circuit board.

7. The method of claim 1 wherein removing a portion of the conductive layer corresponding to the exposed portion of the resist layer includes removing partially removing conductive material between a first conductor in a first interior layer of the printed circuit board and a second conductor in a second interior layer of the circuit board.

* * * * *